(12) United States Patent
Nishio et al.

(10) Patent No.: US 6,771,481 B2
(45) Date of Patent: Aug. 3, 2004

(54) PLASMA PROCESSING APPARATUS FOR PROCESSING SEMICONDUCTOR WAFER USING PLASMA

(75) Inventors: Ryoji Nishio, Mito (JP); Seiichiro Kanno, Chiyoda (JP); Hideyuki Yamamoto, Kudamatsu (JP); Akira Kagoshima, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 431 days.

(21) Appl. No.: 09/796,494

(22) Filed: Mar. 2, 2001

(65) Prior Publication Data

US 2002/0114123 A1 Aug. 22, 2002

(30) Foreign Application Priority Data

Dec. 28, 2000 (JP) ........................................ 2000-401545

(51) Int. Cl.[7] .............................................. B23B 31/28
(52) U.S. Cl. ...................... 361/234; 361/145; 361/233; 269/8; 279/128; 29/829
(58) Field of Search ................................ 361/234, 233, 361/145; 269/8; 279/128; 29/829

(56) References Cited

U.S. PATENT DOCUMENTS

| 5,467,013 A | * | 11/1995 | Williams et al. ............ 324/127 |
| 5,808,415 A | | 9/1998 | Hopkins |
| 5,939,886 A | | 8/1999 | Turner et al. |
| 6,061,006 A | | 5/2000 | Hopkins |
| 6,091,257 A | | 7/2000 | Verkuil et al. |
| 6,184,623 B1 | * | 2/2001 | Sugai et al. ............ 315/111.21 |
| 6,197,116 B1 | | 3/2001 | Kosugi |
| 6,291,999 B1 | * | 9/2001 | Nishimori et al. .......... 324/464 |

FOREIGN PATENT DOCUMENTS

JP 7-135180 A 5/1995 ........... H01L/1/205

OTHER PUBLICATIONS

AEC/APC Symposium XII, Forum Ballrooms I & II, Monday, Sep. 25, 2000.

* cited by examiner

Primary Examiner—Brian Sircus
Assistant Examiner—Isabel Rodriguez
(74) Attorney, Agent, or Firm—Antonelli, Terry, Stout & Kraus, LLP

(57) ABSTRACT

A plasma processing apparatus comprises: a body that comprises a vacuum processing chamber with a wafer stage on which a semiconductor wafer is held, a plasma producing unit for producing plasma within the vacuum chamber, and a high frequency source for applying a high frequency bias voltage to the wafer stage. A control unit controls various parameters of the body of the plasma processing apparatus. The control unit comprises a detecting unit for detecting the high frequency voltage or high frequency current applied to the wafer stage and for calculating a difference in phase between the high frequency voltage and the high frequency current, and a unit for obtaining a characteristic of the plasma or an electric characteristic of the plasma processing apparatus based on the detected high frequency voltage, the detected high frequency current, and the obtained difference in phase.

21 Claims, 12 Drawing Sheets

PLASMA PROCESSING APPARATUS FOR PROCESSING SEMICONDUCTOR WAFER USING PLASMA

CROSS-REFERENCE TO RELATED APPLICATION

The present invention is related to U.S. patent application Ser. No. 09/799,527, filed Mar. 7, 2001, entitled "Semiconductor Manufacturing Apparatus and Method of Processing Semiconductor Wafer Using Plasma, and Wafer Voltage Probe."

BACKGROUND OF THE INVENTION

The present invention relates to plasma processing apparatus, and more particularly to such apparatus that process semiconductor wafers, using controlled plasma.

Circuit patterns have recently traced the course of becoming detailed, because of the high integration of semiconductor devices. The processing size in demand is becoming even tougher. In addition, besides the fact that enlarging the size of the diameter of wafers is underway for the purpose of improving productivity, the application of new materials and the modification of wiring structures are being considered, to improve the performance of the elements. In keeping with these new technologies, the development of a new processing technology is underway. However, the development of this processing technology is extremely difficult and costly.

Under these circumstances, even though the same process were to be executed vis-à-vis each respective wafer, using similar types of manufacturing devices, problems such as mechanical differences in the devices causing discrepancies in processing results, and aging, as the number of wafers being processed with the same manufacturing device increases, causing changes in processing results is growing. These problems consequently are extremely serious, because they will bring about decreased operational rates in the devices, reduced yields due to mixture of foreign matter, and an extended period of, as well as increased cost in, the development of processing technology.

An apparatus that processes wafers, using plasma, for example, a plasma etcher or a plasma CVD, among the semiconductor manufacturing apparatus, solves the problems by monitoring the plasma state on a display device, controlling various parameters based on the monitored result, and further controlling the result of the processing. In constructing and monitoring the manufacturing process as just mentioned, it is very important to especially grasp the characteristic of the plasma and more particularly information on the electron density and temperature of the plasma.

In the measurement of plasma characteristic in a prior-art processing apparatus and/or method using plasma, a measuring method using electromagnetic waves with the aid of a microwave interferometer and Langmuir probe method have been used.

The microwave interferometer has a pair of windows each provided in a respective one of a pair of opposite walls of an container in which plasma is being produced. A microwave is entered through one of the pair of windows into the container, a microwave outgoing from the other window is detected, and an electron density is calculated based on the difference in phase between the incident and outgoing microwaves.

In the Langmuir probe method, a small metal probe (electrode) is inserted into and exposed to the plasma and a DC bias voltage and a high frequency voltage are applied to the probe. A resulting change in the current is used to calculate the electron density and temperature.

In the measuring methods using electromagnetic waves, the device used is complicated and difficult to handle. That is, use of a large-scaled expensive device and difficult adjustment of the microwave transmission path are required. Furthermore, the windows for the incident and outgoing microwaves are required to be clean in order to acquire a required accuracy of the measurement.

In the Langmuir probe method that requires insertion of the electrode into the plasma, pollution of the wafers to be processed with the electrode material and deposition of an insulating film on a surface of the probe make the measurement impossible. Thus, a long-time measurement is impossible. Since there is a high probability that foreign matters produced from the probe construct will reduce the yield, the Langmuir probe method has not been used in the manufacturing site, like the electromagnetic method. In an apparatus that uses a capacitively coupled plasma source, a high frequency field intensity in the plasma is very high. Thus, the probe method cannot be used because the voltage-current characteristic of the probe is disturbed by the high frequency field, which cannot make accurate measurement.

Recently, measuring methods that have conquered these drawbacks as far as possible have been developed. A typical measurement method is disclosed in JP-A-8-222396, wherein the plasma characteristic is measured by an electrode attached to a wall. This method is to calculate the electron density from a series resonance frequency produced in the plasma in accordance with the principle of a self excited electron plasma resonance spectroscopy. Another typical method is a high frequency probe method disclosed in JP-A-2000-100599. In this method, an electrode covered with an insulator radiates high frequencies into plasma, and a particular high frequency that is absorbed to a maximum by the plasma is obtained based on a high frequency characteristic of those reflected waves from the plasma. The electron density is then calculated based on the particular high frequency.

SUMMARY OF THE INVENTION

However, those new measuring methods also have problems. In the self-excited electron plasma resonance spectroscopy disclosed in JP-A-8-222396, the sensor is attached to the wall of the container within which the plasma is to be produced. Thus, resulting information on the plasma represents an average electron density present between the plasma container wall and the high frequency radiator. In the processing using the plasma, the processing performance is determined depending on what plasma is produced near the discharge electrodes that produces the plasma or as a result how the plasma characteristic is near the workpiece. Thus, information on the processing state is reduced at the average electron density.

The method disclosed in JP-A-2000-100599 has a merit that continuous measurement is possible even when an insulating film is deposited on the surface of the sensor. It, however, still has the drawback that information on the plasma near the workpiece is difficult to obtain. This is because when the probe is brought close to the workpiece, the probe itself will disturb the plasma characteristic to thereby prevent normal processing, and because a film deposited on the probe surface is separated to become foreign substances to the workpiece to thereby prevent normal processing and reduce the yield. As a result, the probe cannot be inserted around the workpiece in the apparatus in the manufacturing line.

The present invention has been made in view of the above problems. It is an abject of the present invention to provide a plasma processing apparatus free from the problems with the prior art.

Another object of the present invention is to provide a plasma processing apparatus capable of acquiring information on the state of plasma near a workpiece, for example, information on at least one of the electron density and temperature of the plasma, without inserting a special sensor into the plasma around the workpiece.

A further object of the present invention is to provide a plasma processing apparatus that controls the working process based on acquired information on the plasma state.

In order to achieve the above objects, one aspect of the present invention, a plasma processing apparatus comprises: a body that comprises a vacuum processing chamber that contains a wafer stage on which a semiconductor wafer is held, a plasma producing unit for producing plasma within the vacuum chamber, and a high frequency source for applying a high frequency bias voltage to the wafer stage; and a control unit for controlling various parameters of the body of the plasma processing apparatus, the control unit comprising a detecting unit for detecting the high frequency voltage or high frequency current applied from the high frequency source to the wafer stage or for calculating a difference in phase between the detected high frequency voltage and current.

According to another aspect, the electron density and temperature of the plasma is calculated based on the detected high frequency voltage, the detected high frequency current, and the obtained difference in phase between the high frequency voltage and the high frequency current to thereby control the body of the plasma processing apparatus.

DETAILED DESCRIPTION OF THE EMBODIMENTS

Figure 1:
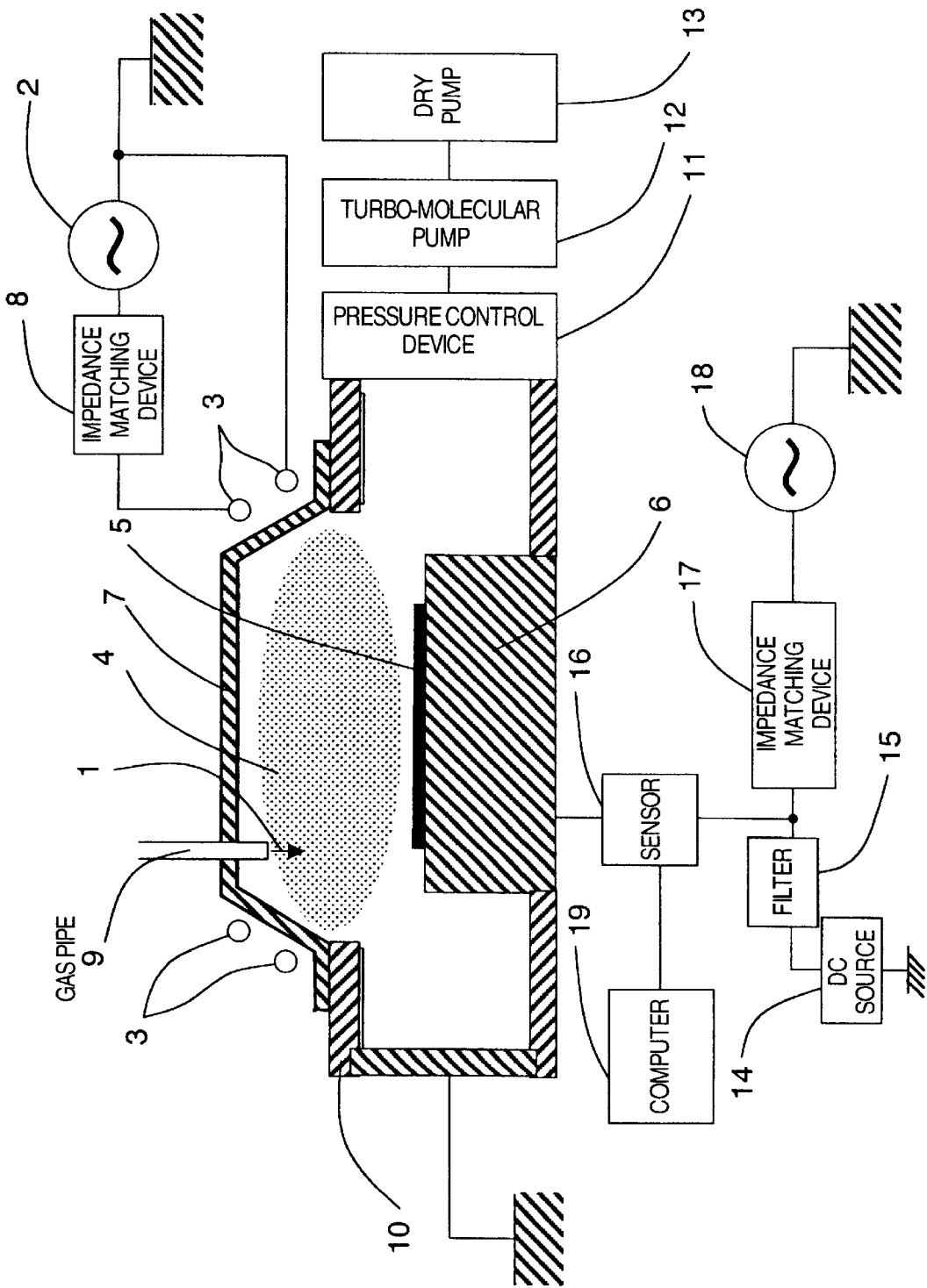
FIG. 1 illustrates a composition of a plasma processing apparatus according to a first embodiment of the present invention.

Embodiments of the present invention will be described with reference to the accompanying drawings. First, a first embodiment of the present invention will be described with reference to FIGS. 1–6. In the following description, respective components of second-fifth embodiments having the same or similar function as a component of the first embodiment are denoted by the same reference numeral as that used to denote that of the first embodiment and further description thereof will be omitted.

FIG. 1 illustrates a plasma processing apparatus according to the first embodiment. In FIG. 1, reference numeral 1 denotes a processing gas, which is introduced via a gas pipe 9 into a vacuum processing chamber (vacuum chamber). Reference numeral 2 denotes a high frequency source used for producing plasma. Reference numeral 3 denotes a coil across which the high frequency source 2 is applied. Reference numeral 4 denotes plasma to which the processing gas has been changed by electric and magnetic fields produced by the coil 3. Reference numeral 5 denotes a semiconductor wafer as a workpiece. Reference numeral 6 denotes a wafer stage on which the wafer 5 is placed. Reference numeral 7 denotes a structure made of a dielectric material. Reference numeral 8 denotes an impedance matching device. Reference 9 denotes the gas pipe. Reference numeral 10 denotes a construct made of a grounded metal that cooperates with the structure 7 to form the vacuum processing chamber. Reference numeral 11 denotes a pressure control device that controls the pressure of the plasma; 12 a turbo-molecular pump; and 13 a dry pump that discharges the processing gas and reaction products. Reference numeral 14 denotes a DC power source used for electrostatic chuck of the wafer; and 15 a filter to cut off high frequencies. Reference numeral 16 denotes a sensor for sensing a high frequency voltage, a current fed by the high frequency source 18 and a phase different between the voltage and the current; and 17 an impedance matching device. Reference numeral 18 denotes the high frequency source that applies a high frequency bias to the wafer and pulls in ions present in the plasma into the wafer. Reference numeral 19 denotes a (personal) computer that composes a control unit for controlling various parameters of a body of the plasma processing apparatus. This computer analyses an output from the sensor 16 and controls the plasma processing apparatus based on a result of the analysis.

The processing gas 1 introduced via the gas pipe 9 into the processing chamber, composed of the dielectric structure 7 and the grounded mental structure 10. The gas is then changed to plasma 4 by magnetic and electric fields produced by the coil 3 across which the high frequency voltage is applied via the impedance matching device 8 from the high frequency source 2. The semiconductor wafer 5 as the workpiece is placed on the wafer stage 6. In order to pull in ions in the plasma effectively into the semiconductor wafer, the high frequency source 18 is connected via the impedance matching device 17 to the wafer stage 6 to thereby apply a high frequency bias to the wafer. The DC power source 14 is connected to the output of the impedance matching device 17 via the filter 15 that cuts off high frequencies from the high frequency source 18 to thereby perform electrostatic chuck of the wafer to the wafer stage. The sensor 16 that measures the high frequency current and voltage applied by the high frequency source 18 and a phase difference between the voltage and current is provided between the output of the impedance matching device 17 and the wafer stage 6. Outputs from the sensor 16 are collected and analyzed by the computer 19. Reference numeral 11 denotes the pressure control device that controls the pressure of the plasma. The processing gas and reaction products are discharged via the turbo-molecular pump and the dry pump.

Figure 2:
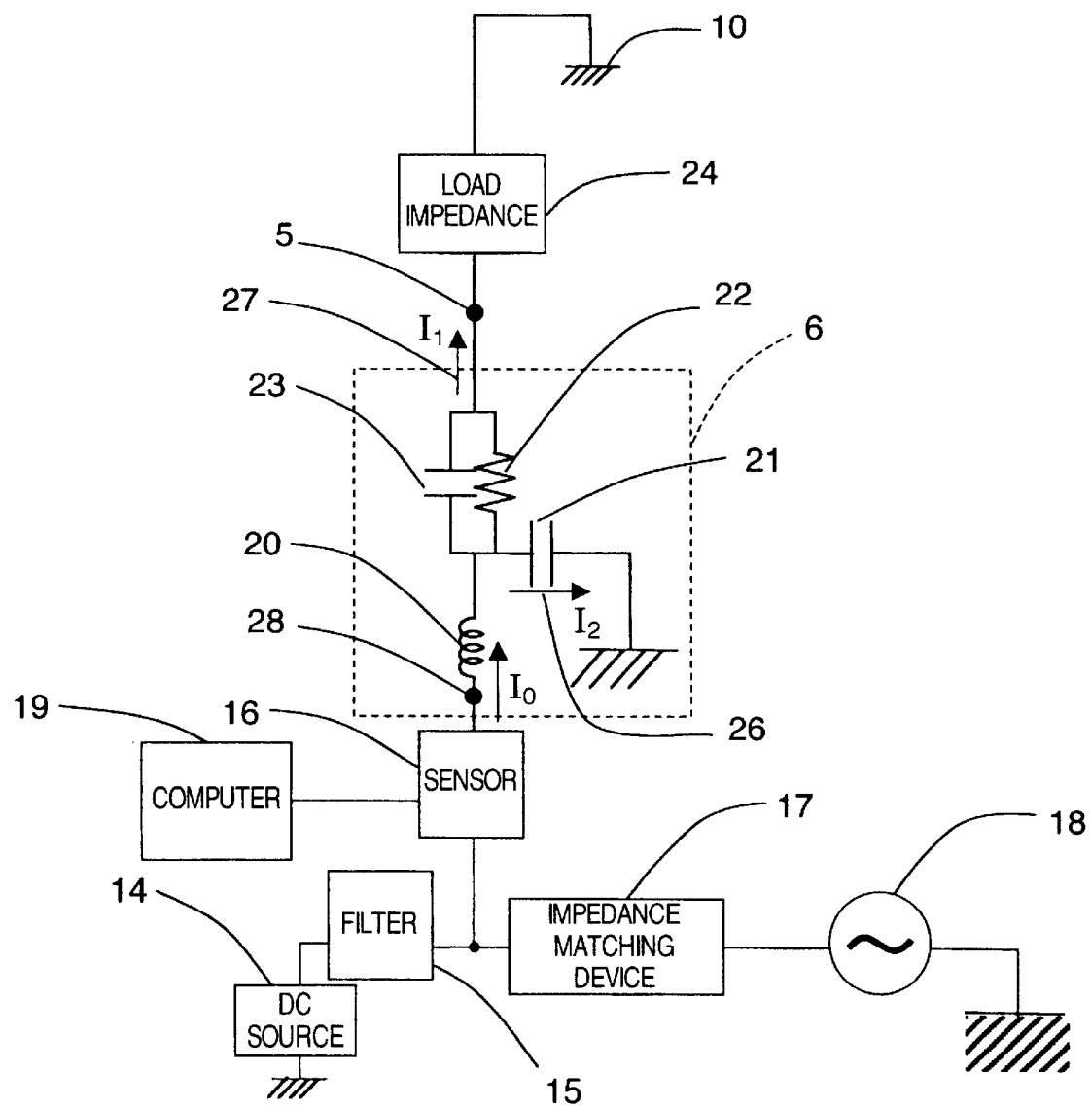
FIG. 2 illustrate a method of obtaining an electric current that flows through a semiconductor wafer, a voltage appearing across the wafer, and a related load impedance.

With reference to FIG. 2, a method of obtaining an electric current flowing in the semiconductor wafer, a voltage produced at the semiconductor wafer and a load impedance formed through the plasma between the semiconductor wafer 5 and a grounding point of the apparatus. In FIG. 2, reference numeral 10 denotes a ground potential of the processing chamber; and 24 the load impedance. A broken line block in FIG. 2 shows the wafer stage 6 by whereas an equivalent circuit of the wafer stage is shown in the broken line block. The equivalent circuit is composed of a high frequency input point 28, an inductance 20 involved in a power line, a capacitor 21 representing a capacitive component formed between the power line and the ground potential, and a resistance component 22 and a capacitive component 23 of a dielectric film for electrostatic chuck of the wafer with an output 5 of the wafer being connected with the load impedance 24. Since in the present embodiment the impedance of the resistance component 22 is larger than that of the capacitive component 23, the impedance of the resistance component 22 is negligible.

A high frequency signal picked up by the sensor 16 is analyzed by the computer 19 to provide a voltage V0 and a current I0 at the high frequency input point 28, and a difference in phase $\theta$ between V0 and I0. As a result, if a whole load impedance as viewed from the high frequency input point 28 is put as Z0=A+jB, A=V0/I0*cos $\theta$ and B=V0/I0*sin $\theta$, where j=$(-1)^{1/2}$. A and B represent a real resistance component and an imaginary component, respectively, of the whole load impedance Z0.

Let the load impedance (Zp) 24 be Zp=a+jb where a and b are the real resistance and imaginary components, respectively. Furthermore, let the impedances of the capacitive component 23, capacitive component 21, and inductance component 20 be Xsdc, Xc, and XL, respectively. Then, from the equivalent circuit of FIG. 2. the following expressions (1) and (2) are obtained:

$$A=\{a(b-Xsdc)Xc-aXL(b-Xsdc-Xc)+a(XL-Xc)(b-Xsdc-Xc)\}/\{a^2+(b-Xsdc-Xc)^2\} \quad (1)$$

$$B=[a^2(XL-Xc)-(b-Xsdc-Xc)(Xc(b-Xsdc)-XL(b-Xsdc-Xc))]/\{a^2+(b-Xsdc-Xc)^2\} \quad (2)$$

By solving the expressions (1) and (2) as simultaneous equations, a and b are obtained, and the load impedance 24 is determined. In FIG. 2, let electric currents flowing in the semiconductor wafer 5 and the capacitive component 21 be I1 and I2, respectively. In this case, the following expressions (3) and (4) hold in conformity with Kirchhoff's law with reference to the current I1 flowing through the semiconductor wafer 5 and a voltage drop occurring in the semiconductor wafer 5, respectively:

$$I0=I1+L2 \quad (3)$$

$$-jI2Xc=I1(-jXsdc+a+jb) \quad (4)$$

When I1 is put as I1=$\alpha$+j$\beta$, $\alpha$ and $\beta$ are respectively $\alpha$=10Xc(Xsdc-b-Xc)/$\{(Xsdc-b-Xc)^2+a^2\}$, and $\beta$=-aI0Xc/ $\{(Xsdc-b-Xc)^2+a^2\}$. The component a represents a real current flowing in the semiconductor wafer, and the component $\beta$ is an induction current. At this time, a voltage drop Vw produced across the semiconductor wafer is determined as Vw=Zp*I1.

As described above, by using the equivalent circuit of the wafer stage, the voltage produced across the semiconductor wafer, the real and inductive currents flowing into the semiconductor wafer, and the real resistance and imaginary components of the load impedance are obtained from the voltage, current and difference in phase between the voltage and current measured at the input of the wafer stage. In this equivalent circuit, the composition of the circuit components (capacitance, resistance, reactance) and its impedance change, and the circuit composition itself changes depending on the structure of the wafer stage. In addition, the frequency of the high frequency source 18 changes the impedance of the equivalent circuit. However, as long as the equivalent circuit is an accurate one, it is ensured that the voltage produced across the semiconductor wafer, the real and inductive currents flowing into the semiconductor wafer, and the real resistance and imaginary components of the load impedance can be induced from the voltage, current and phase difference measured at the wafer stage input point by using the same technique as mentioned above.

Figure 3:
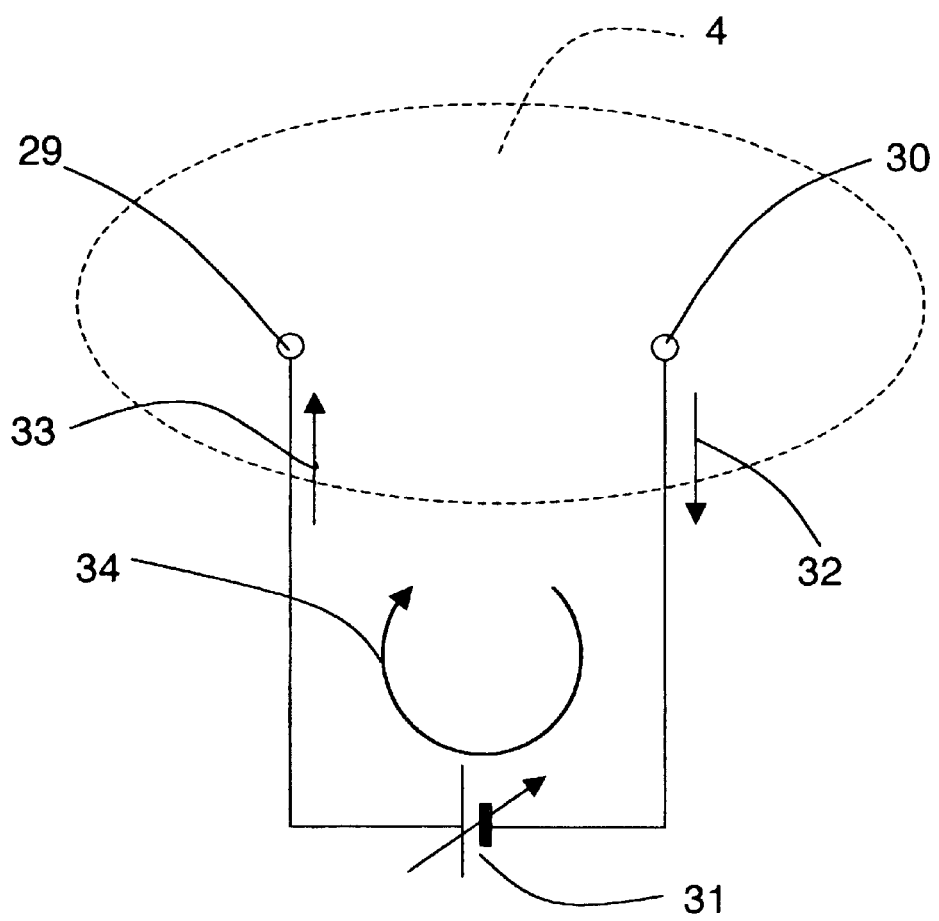
FIG. 3 illustrates the principle of a double probe method.

The principle of the double probe method will be first described with reference to FIG. 3 in order to explain a technique for measuring the electron temperature and density of plasma near the semiconductor wafer. FIG. 3 illustrates a basic circuit composition used in the double probe method. As shown, a pair of close probes P1 and P2 having the same shape and area are inserted into the plasma 4. The pair of probes P1 and P2 are connected to a variable voltage power source 31 disposed therebetween. The variable voltage power source 31 provides a voltage Vd applied across the pair of probes P1 and P2. When Vd changes, an electric current Ip flows through a closed circuit including the plasma 4. At this time, the currents Id1 and Id2 flowing through the probes P1 and P2, respectively, are in a relationship are Ip=Id1=Id2. In this case, the current Id1 flows away from the probe P1 whereas the current Id2 flows into the probe P2. That is, since those currents have opposite directions, an electron current from the plasma flows into one of P1 and P2 whereas an ion current flows into the other of P1 and P2. If P1 is higher in potential than P2, the electron current flows into P1 whereas the ion current flows into P2. By measuring an electric current Ip flowing when Vd is changed in this closed double probe circuit, the current-voltage characteristic of the double probe is obtained.

Figure 4:
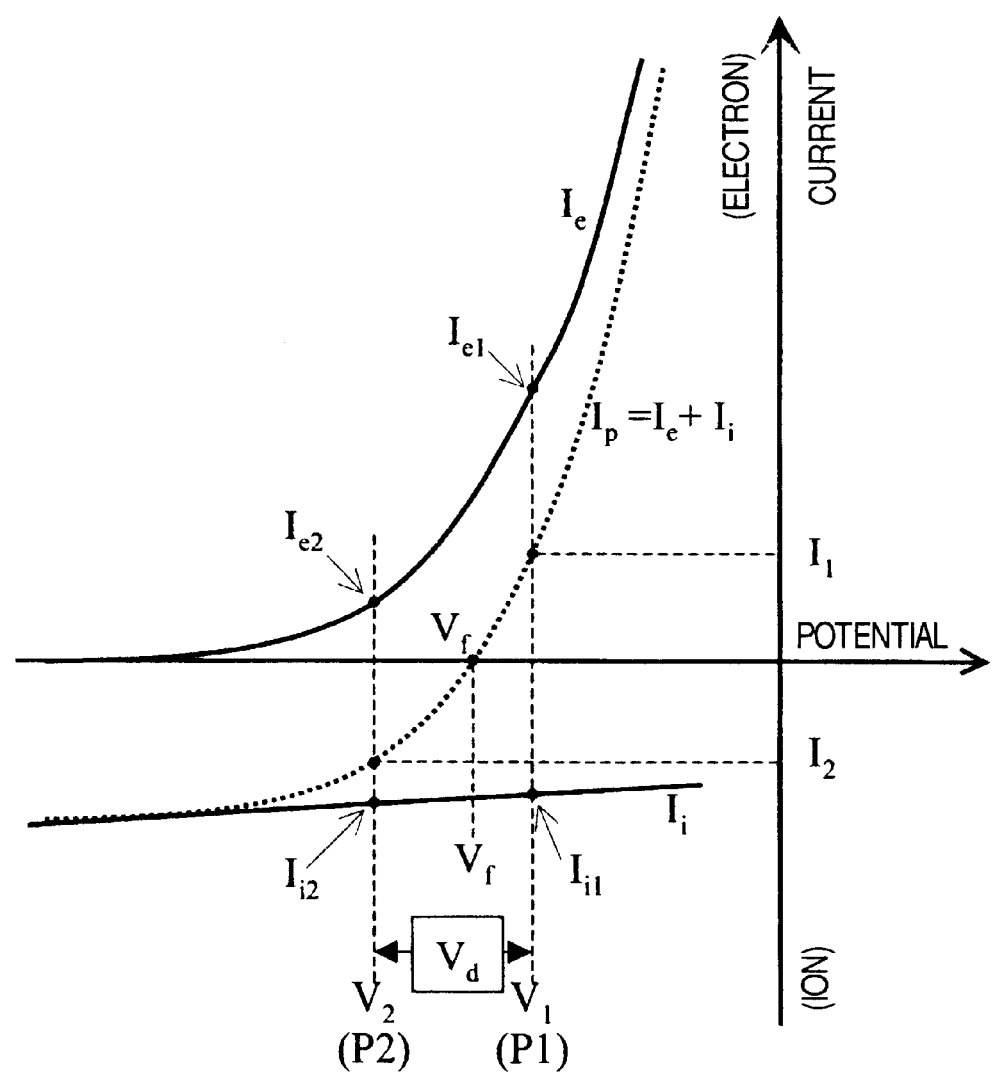
FIG. 4 illustrates the relationship between a current flowing through the double probe and a probe potential.

The relationship between the electric current flowing through the double probe and the probe potential applied across the pair of probes will be described with reference to FIG. 4. Since electrons and ions diffuse always within the plasma, the plasma has a characteristic that it can be a source of supplying an electron current Ie and an ion current Ii. Ie and Ii are shown by thick solid lines in FIG. 4. Since the absolute values of the electron and ion currents flowing through the probes are different depending on the probe potential, dependence of the probe current Ip on the probe potential is as shown by a broken line in FIG. 4. A relationship Ip=-Ie+Ii holds at all times, which is determined by diffusion of electrons and ions flowing from the plasma to the probes. When the voltage Vd applied across the probes P1 and P2 by the power source 31 is 0V, the probes are at a potential Vf so that no current flows seemingly into the probes. That is, Ip=0 A and Ie=Ii. This is because P1 and P2 that compose parts of the closed circuit float electrically, which derives from a quasi neutral condition of the plasma. The charged potential Vf is referred to as a plasma floating potential. When Vd$\neq$0 V, the probe P1 shifts from Vf to a positive potential V2 whereas the probe P2 shifts from Vf to a negative potential V2 so that a probe current Ip=Id1=Id2 flows. At this time, a relationship Vd=V1-V2 holds. Since a change in the electron current Ie is sharp compared to a change in the ion current Ii, most of the applied voltage Vd shifts to the V2 side. Thus, a relationship |V1-Vf|<|Vf-V2| holds at all times. When the applied voltage Vd changes, Ip also changes. At this time, since the closed circuit is formed, a maximum value of Ip is always limited by the ion current Ii. Thus, there is the characteristic that when the applied voltage Vd increases, Ip is saturated finally with the ion current.

Figure 5:
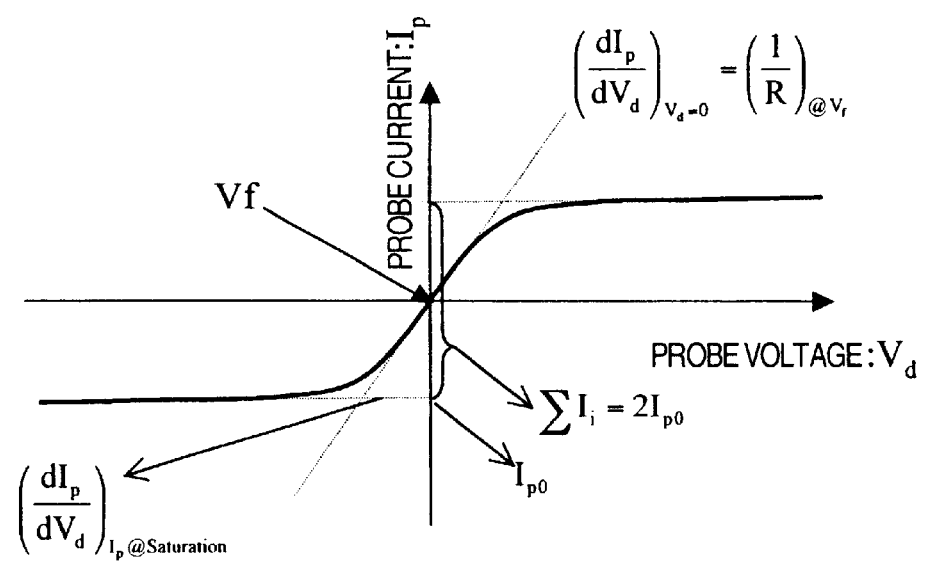
FIG. 5 illustrates the relationship between the voltage applied across the probe and the probe current.

FIG. 5 shows the relationship between the applied voltage Vd and probe current Ib, as thus obtained. A current-voltage characteristic obtained for a Vd having a polarity is shown, for example, by a right half of the characteristic shown by the solid line in FIG. 5. When the polarity of the applied voltage Vd is inverted and the voltage Vd is changed, conversely a left half of the characteristic of FIG. 5 is obtained. That is, the voltage-current characteristic of the double probe has a diagrammatical feature that the characteristic is of axis symmetryl. In order to obtain the electron temperature and density of the plasma from this characteristic, three quantities must be read: that is, one is a gradient of a portion of the characteristic representing a saturation characteristic of the current, (dIp/dVd) Ip@ saturation; a second one is a current value Ip0 obtained by extrapolation using a straight line representing a gradient when Vd=0 V; and a third one is a gradient of a current-voltage characteristic (dIp/dVd)$_{Vd=0 \ V}$ when Vd=0V, that is, when the probes are at the plasma floating potential Vf. It is important that this gradient is a reciprocal of the real resistance value at Vd=0 V. That is, (dIp/dVd)$_{Vd=0 \ V}$=1/R$_{@vf}$. The electron temperature is determined based on those three quantities in accordance with the following expression (5):

$$\frac{kT_e}{e} = -\frac{\sum I_i}{A_1 \left(\frac{dI_p}{dV_d}\right)_{v_d=0} - A_2 \left(\frac{dI_p}{dV_d}\right)_{I_p @ Saturation}} \quad (5)$$

where k is Bolzman constant, Te is the electron temperature, e is an electron charge, and ΣIi=2Ip0. A1 and A2 are given as A1=4, and A2=3.28, respectively. The electron density can be calculated in accordance with the following expression (6).

$$I_{p0} = kN_e e \left(\frac{kT_e}{m_i}\right)^{0.5} S_p \quad (6)$$

where κ is a coefficient (=0.61), Ne is the electron density; mi is the ion mass; and Sp is a surface area of the probe (semiconductor wafer).

Next, a method of obtaining the high frequency characteristic of the semiconductor wafer within the plasma from the voltage and current measured at the input point of the wafer stage, and the difference in phase between the voltage and the current, and then obtaining the above-mentioned three quantities necessary for analyzing the electron temperature and density will be described. To this end, the relationship between the high frequency voltage applied across the semiconductor wafer and the real current flowing from the plasma into the semiconductor wafer will be described with reference to FIG. 6. The dependency of the real current flowing in the semiconductor wafer on its potential is such that when the potential of the semiconductor wafer is negative relative to the plasma floating potential, the ion current flows. When the potential of the semiconductor wafer is positive relative to the plasma floating potential, the electron current flows. This is exactly the same characteristic as determined by diffusion of the electrons and ions from the plasma to the double probe, as described with reference to FIG. 4. Since the area of the semiconductor wafer is several thousands to several ten thousands times the area of each of the probes used in the double probe measurement, the absolute value of the current flowing into the semiconductor wafer is large correspondingly. However, the dependency of the current on the probe potential is exactly the same as that of Ip of FIG. 4.

Figure 6:
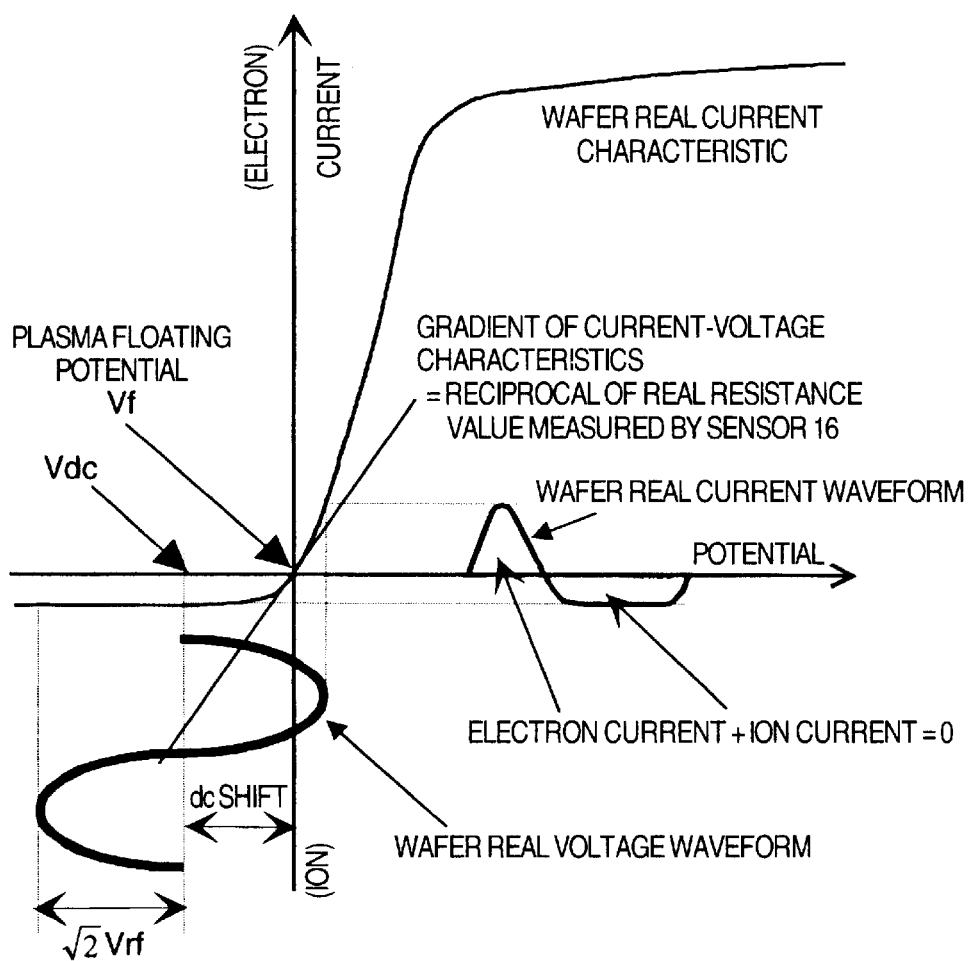
FIG. 6 illustrates the relationship between the voltage applied across the probe and a real current flowing from plasma to a semiconductor wafer.

When no high frequency voltage Vrf is applied across the semiconductor wafer, or Vrf=0, the semiconductor wafer is at the plasma floating potential Vf as in the case of the double probe. This is because the semiconductor wafer floats electrically. This phenomenon occurs on exactly the same principle as in the case of the double probe. Thus, in this case, electrons and ions of the same quantity flow into the semiconductor wafer. Therefore, no current flows apparently. When Vrf≠0 V and the high frequency potential is positive compared to the plasma floating voltage Vf in a cycle of the high frequency, the electron current flows into the semiconductor wafer. When the high frequency potential is negative compared to the plasma floating potential Vf, the ion current flows into the semiconductor wafer. When the electron current and the ion current that flow into the semiconductor wafer are unequal, electric charges are stored in the semiconductor wafer to thereby shift the potential of the wafer from Vf. As in the double probe, the dependency of the electron current, which flows into the semiconductor wafer, on the potential of the semiconductor wafer changes more rapidly than the dependency of the ion current on the potential of the wafer, electrons are stored in the semiconductor wafer. Thus, a time-averaged potential of the semiconductor wafer, or the DV potential, is low compared to the plasma floating potential Vf. As a result, the high frequency potential of the wafer vibrates around at a potential lower than the plasma floating potential Vf. Thus, a more ion current flows into the semiconductor wafer whereas a less electron current flows into the wafer. A reduction in the time-average potential of the semiconductor wafer continues until the electron current and ion current flowing into the semiconductor wafer are equal and no more electric charges are stored in the semiconductor wafer. As shown in FIG. 6, as a result, the voltage waveform of the wafer vibrates around the charged potential Vdc. At this time, as shown in FIG. 6, the total electron current flowing into the semiconductor wafer is equal to the total ion current flowing into the semiconductor wafer in one high frequency cycle. Such DC shift occurring in the semiconductor wafer potential is referred to as a self-biasing effect. This is a phenomenon occurring based on the quasi-neutral condition of plasma. As in the double probe, the current flowing into the semiconductor wafer is limited by the ion saturation current. As will be seen in the description of the principle of the double probe method and the real current flowing in the semiconductor wafer, the dependency of the probe current Ip on the probe voltage Vd in the double probe is exactly the same as the dependency of the high frequency real current on the high frequency potential Vrf applied across the semiconductor wafer. Different points are that while in the double probe the condition always holds that the electron current is equal to the ion current between the two probes whereas in the semiconductor wafer the condition holds that the electric current is equal to the ion current in one cycle of the high frequency. In the case of the double probe, its voltage-current characteristic is obtained, using the DC voltage, whereas in the case of the semiconductor wafer, its voltage-current characteristic that is the same as that of the double probe is obtained, using the high frequency voltage.

As described above, the double probe method and the nature of the current flowing in the wafer when the high frequency voltage is applied across the wafer are well known. The inventors pay attention to the fact that the double probe method and the nature of the current flowing in the wafer, as just described, are based on their respective equivalent principles, and proves that the same current-voltage characteristic as the double probe method can be obtained from the current-voltage characteristic of the wafer obtained when the high frequency is applied to the wafer to thereby realize the present invention. Thus, in the case of the present invention, the dependency of the real current value Iwr, which flows into the semiconductor wafer, on the high frequency voltage Vrf applied across the wafer is required to be obtained without obtaining the double probe characteristic. From the current-voltage characteristic, a straight line of a gradient (dIp/dVd) Ip@ saturation=(dIwr/dVrf) Iwr@ saturation representing a saturation characteristic of the current can be obtained, and the current value Ip0 at Vrf=0 V can be obtained easily by extrapolation using the straight line of the gradient. It is seen that the expression $(dIp/dVd)_{Vd=0\ V} = (dIwr/dVrf)_{Vrf=0\ V} = 1/R_{@Vf}$ is required to be a reciprocal of a real resistance value of the load impedance as viewed from the semiconductor wafer when Vrf=0 V. Since the real resistance value at Vrf=0 V cannot be directly measured, the dependency of the real resistance value on Vrf is measured, and a real resistance value at Vrf=0 V is calculated by extrapolation, using the dependency of the real resistance value. By calculating those three numerical values in the high frequency measurement, the electron temperature and density near the semiconductor wafer can be determined, using the expressions (5) and (6).

Figure 7:
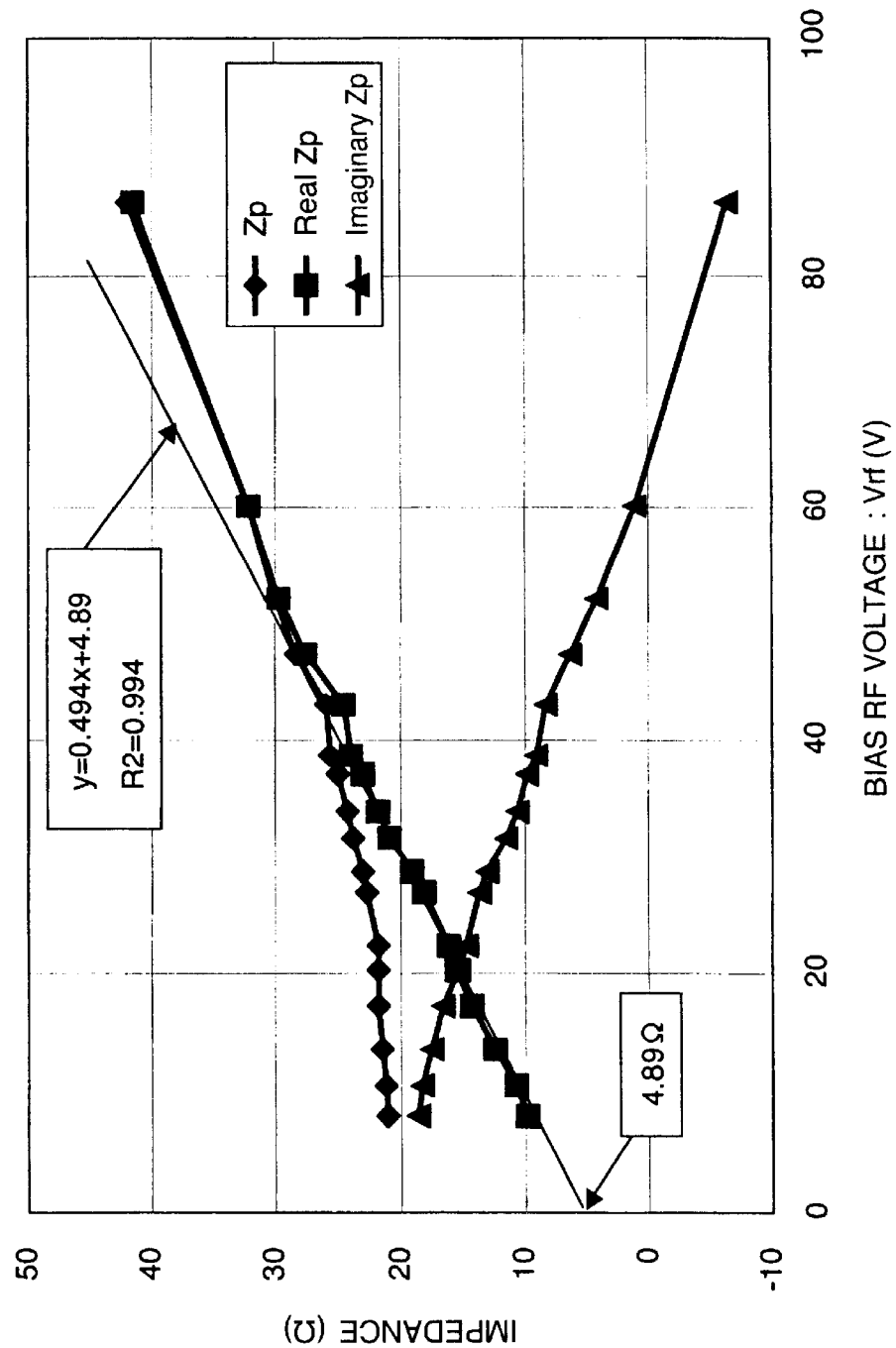
FIG. 7 illustrates a measured plasma characteristic according to the first embodiment of the present invention.
Figure 8:
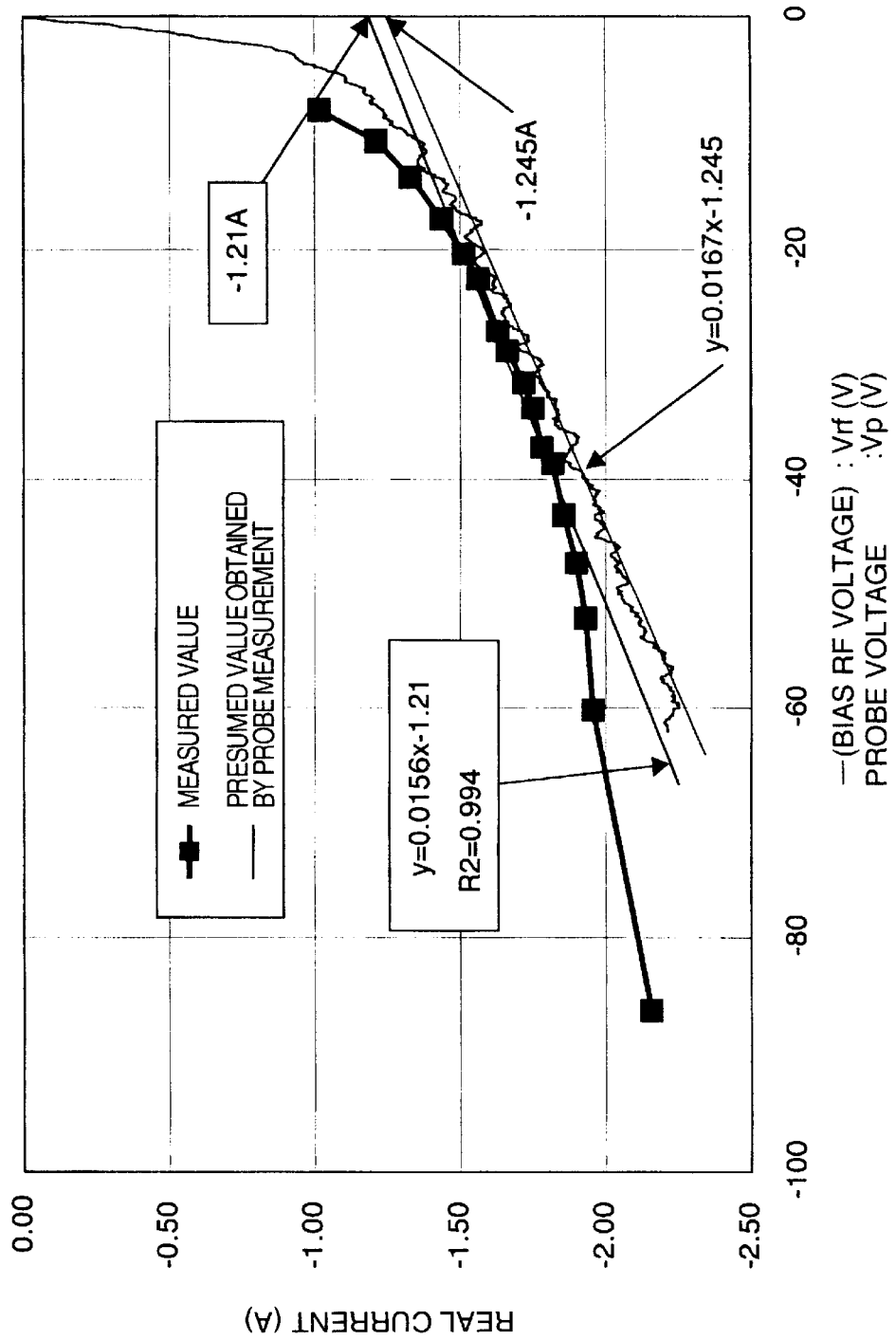
FIG. 8 illustrates another measured plasma characteristic according to the first embodiment.

In order to probe that the current-voltage characteristic that is the same as the double probe method can be extracted from the current-voltage characteristic of the wafer obtained when the high frequency is applied to the wafer, a specified plasma characteristic measuring method will be described in the first embodiment. An argon gas flow and a pressure adjuster 11 were adjusted so that the inner space of the vacuum chamber of FIG. 1 was filled with an argon gas at 0.4 Pa. A high frequency of 1 kW at 13.56 MHz was applied across the coil 3 from the high frequency source 2 and the impedance matching device 8 was adjusted to produce plasma 4. The DC power source 14 was used and a 8-inch silicon wafer was chucked as the semiconductor wafer 5 to the wafer stage 6. The high frequency source 18 applied to the wafer a 800-kHz high frequency power in a range of 10–65 W. At this time, the high frequency current and voltage and the difference in phase between the current and the voltage were measured by the sensor 16. Resultant data was then stored in the computer 19. A single probe (not shown) was set at a position 11 mm up from a center of the wafer and measured the plasma characteristic. Thus, results of FIG. 7 were obtained. FIG. 7 represents the dependency of a real resistance value of the load impedance on a high frequency voltage Vrf produced across the silicon wafer. By extrapolation using a straight line approximating the dependency of a real resistance value of the load impedance, 4.89Ω was obtained as a resistance value at Vrf=0V. FIG. 8 shows dependency of a real current that has flowed into the silicon wafer on a high frequency voltage Vrf produced across the silicon wafer. By approximating a saturated characteristic portion of the dependency with a straight line, the gradient of the straight line and the current value at Vrf=0V were obtained as 0.0156 and 1.21 A, respectively. By substituting these results into the expressions (5) and (6), 3.16 eV and $1.46 \times 10^{11}$ cm$^{-3}$ were obtained as the electron temperature and the electron density, respectively.

In the single probe measurement, 2.80 eV and $1.20 \times 10^{11}$ cm$^{-3}$ were obtained as the electron temperature and the electron density, respectively. Thus, it was known that the values obtained by this measurement and the corresponding values obtained by the first embodiment of the present invention, as described last, were very close to each other, which proved that the present method was effective.

As described above, according to the present invention, the plasma characteristic can be measured without inserting the sensor into the plasma near the semiconductor wafer and hence without caring a reduction in the yield of the products. In addition, since the sensor is only attached to the atmosphere side of the semiconductor manufacturing apparatus, the attachment of the sensor is simple. Thus, the plasma measurement can be made without changing the existing semiconductor manufacturing apparatus greatly. Since the plasma characteristic near the semiconductor wafer that directly influences the processing of the semiconductor wafer can be measured, this inventive method is appropriate for examining the processed state of the semiconductor wafer. Furthermore, the present invention can also be used as follows. Plasma in a standard state is produced and its characteristic is measured at predetermined intervals of time by the present invention to thereby examine a change in the plasma. By doing so, aging and abnormality of the apparatus can be monitored. Times when the apparatus is stopped/maintained can be determined depending on information on the change. For example, the number of etched wafers is increased while monitoring the plasma characteristic and the electric characteristic of the plasma processing apparatus on a display device (not shown) connected to the computer 9. When a rapid change in the plasma characteristic is recognized after a particular process is made, it can be easily predicted that some abnormality has occurred. Thus, this is usable for monitoring whether the etching is proceeding normally. In this case, occurrence of the abnormality in the apparatus can be immediately recognized to thereby minimize production of wasteful wafers.

In addition, when the characteristic of the plasma in the standard state changes, parameters of the device can be controlled so that the plasma in the standard state is restored. Such control parameters include, for example, the frequency or power of the high frequency source to generate the plasma; the frequency, voltage or power of the high frequency source applied to the wafer stage; the temperature and its distribution of the wall of the vacuum chamber; the temperature and its distribution of the wafer; the processing pressure; the types, flow and mixing ratio of the processing gases; the intensity and its distribution of the magnetic field applied to the plasma; and the etching time. For controlling purposes, a plurality of those parameters may be combined.

The semiconductor products manufactured by the processing method based on the present embodiment have important merits. That is, wafers are processed at all times in a range of predetermined conditions. Thus, the process has very high reproducibility to thereby provide products of high reliability free from irregular performance. Thus, the yield is high in the manufacture, and the cost is reduced to thereby provide products of a reduced cost.

As described above, according to the first embodiment of the present invention, the electron temperature and density of the plasma near the wafer can be determined accurately. To this end, however, there is the problem that the high frequency voltage must be changed as a parameter. Thus, there arises the problem that the electron temperature and the plasma density during etching cannot be measured continuously. This is because high frequency parameters such as the high frequency voltage and/or power must be controlled so as to perform etching normally. The present invention clarified that the real resistance component of the load impedance as viewed from the semiconductor wafer is usable for determining the electron temperature, and that the real current flowing into the semiconductor wafer is usable for determining the plasma density. This implies that information on changes in the electron temperature is available by monitoring on the display device the real resistance component of the load impedance under curtain high frequency voltage requirements during etching. Similarly, by monitoring the real current component flowing in the semiconductor wafer, information on changes in the electron density is obtained. The use of this method enables the plasma characteristic to be monitored even during processing of the semiconductor wafer.

The method of monitoring the load impedance in the separate real resistance and imaginary components or the method of monitoring the current component flowing into the semiconductor wafer in the separate real and inductive current components produces other effects. Those components, especially, the imaginary component represents the electric characteristic of the processing apparatus. The electric characteristics include a change in the static capacitance due to deposits on the semiconductor wafer and changes in the static capacitance/reactance component due to incomplete grounding of the processing apparatus. For example, if the plasma characteristic changes greatly, the two components of the load impedance and the two components of the current change. When a film deposited on the wall of the apparatus is separated from its wall, the imaginary component of the two components of the load impedance and the inductive current component of the two components of the current change mainly because the film only act as a capacitor. By comparing extents of changes in the four components, it can be determined whether the plasma or the apparatus has changed. That is, by employing this method, it is easily performed to specify what is changed or what is the cause of the change in monitoring the processed state of the semiconductor wafer or the aging of the apparatus.

It is now assumed that although the electron temperature and the plasma density measured in a standard state have not changed, the inductive component of the current or the imaginary component of the load impedance have changed. In this case, by developing the just above-mentioned method, it can be determined that, for example, a film is deposited on the apparatus. By calculating an electrostatic capacitance of the deposited film based on a change in the imaginary component of the load impedance, the thickness of the deposited film can be calculated. This is because the electrostatic capacitance C and the film thickness d are related simply as C=ϵ S/d where ϵ is the permittivity of the film and S is an area of the wall on which the film is deposited. The present invention is also usable to monitor the thickness of the film deposited on the inner wall of the apparatus. In the personal computer 19, a database may be prepared in which patterns of changes in the four components and changes in the electron temperature and density are related to the respective states of the semiconductor processing apparatus and its processing process, as described above. It is easily possible to specify, using the database, what has changed and/or what is the cause of the change in the monitoring of the processed state of the semiconductor wafer and a change in the aging of the apparatus, using the database prepared in the personal computer 19. The causes of the aging may include the plasma and all related to the electrical impedance of the plasma processing apparatus, for example, the reproducibility of the semiconductor processing apparatus by reassembling, incomplete examination/connection of the semiconductor processing apparatus in shipment, a deterioration in the grounding of the apparatus due to depositing of an insulating film on a specified region of the apparatus.

Figure 9:
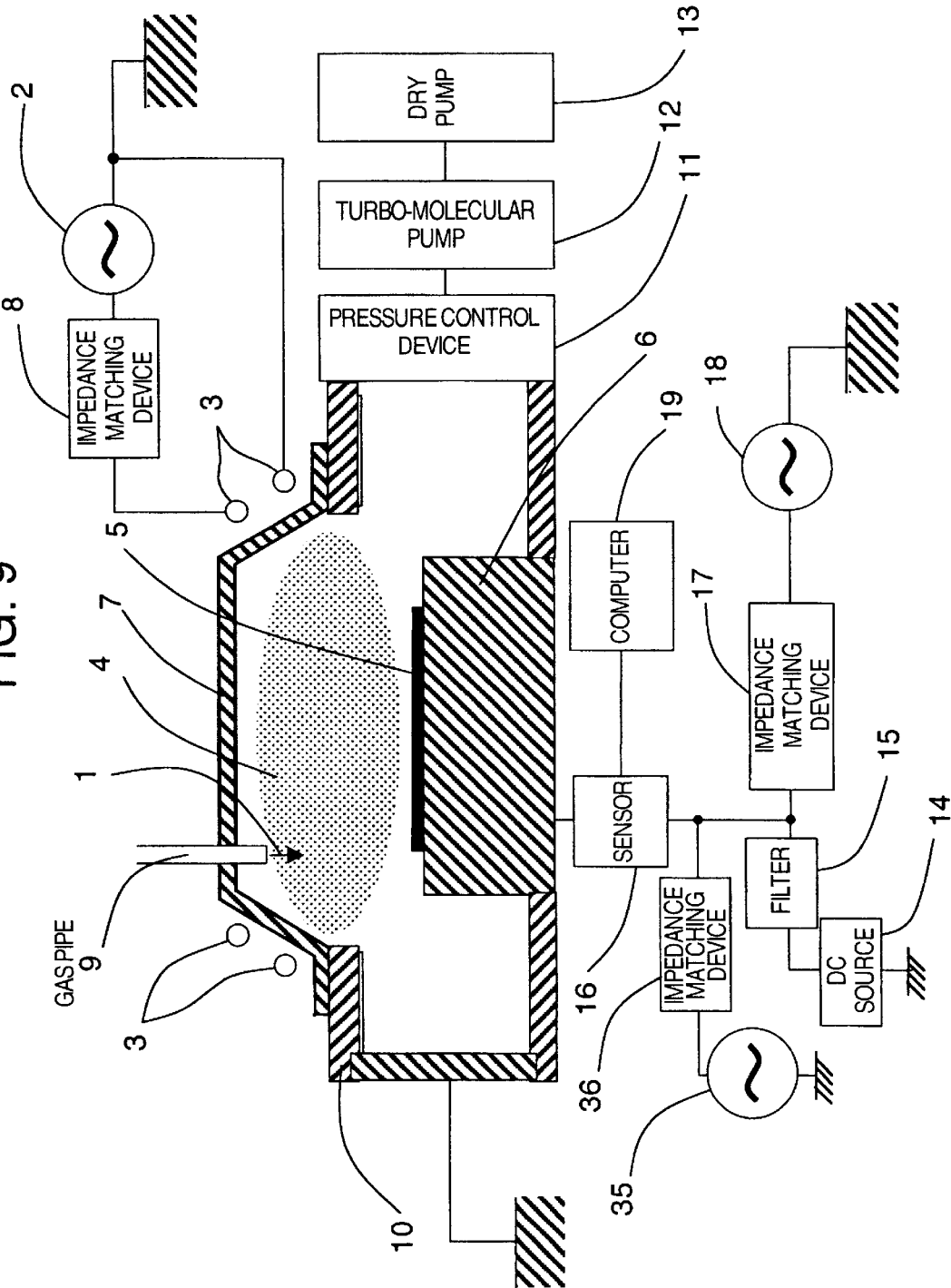
FIG. 9 illustrates a composition of a plasma processing apparatus according to a second embodiment of the present invention.

Referring to FIG. 9, a second embodiment of the invention will be described. As described above, in the first embodiment, the bias of the semiconductor wafer must be changed in the plasma measurement. Thus, the plasma characteristic cannot be measured during processing of the semiconductor wafer, as described above. In FIG. 9, reference numerals 35 and 36 denote a high frequency source and an impedance matching device provided additionally to avoid that problem. In this case, the high frequency source 35 must be different in frequency from the high frequency source 18. In addition, the impedance matching device 36 should have a built-in filter that prevents the power of the high frequency source 18 from reaching the high frequency source 35.

As described above, the high frequency source 18 is used to apply a high frequency bias to the semiconductor wafer 5 whereas the high frequency source 35 is used to measure the plasma characteristic. Thus, the sensor 16 is required to measure a high frequency voltage and a high frequency current having a frequency induced by the high frequency source 35 and a difference in phase between the high frequency voltage and the high frequency current. Reconstruction of the equivalent circuit between the sensor 16 and semiconductor wafer 5, as shown in FIG. 2, is required to the frequency of the high frequency source 35. By using the reconstructed equivalent circuit dedicated to the plasma characteristic measurement, all the measurements described with reference to the first embodiment and all the methods including the monitoring of the semiconductor processing apparatus can be performed completely independent of the operation of the semiconductor manufacturing apparatus.

The high frequency source 35 is not required to produce a high output, but only an output enough to control to about 0–40V a high frequency voltage Vrf produced on the semiconductor wafer. In order to prevent the output of the high frequency source 35 from influencing the processing of the semiconductor wafer, it is recommendable to reduce the measuring time and the frequency so as to produce a high Vrf with a reduced power. As described above, according to the second embodiment, the plasma density and the electron temperature can be monitored without influencing the processing performance even during processing of the semiconductor wafer. Especially, when only the electron temperature is monitored, the voltage produced on the semiconductor wafer can be reduced. In such a case, the high frequency voltage Vrf on the semiconductor wafer requires no higher than 1V. Thus, by reducing the high frequency voltage to the limit of the sensitivity of the sensor 16 and then measuring the real resistance value of the load impedance, the electron temperature can be measured. That is, continuous measurement of the electron temperature is possible. If the sensor 16 measures the electron temperature, using the high frequency of the high frequency source 35, and measures the real current flowing into the semiconductor wafer, using the high frequency of the high frequency source 18, the real current in place of the plasma density and the electron temperature can be monitored continuously. As described above, if the sensor 16 has the functions of measuring a plurality of pairs of high frequency voltages and related currents each pair for a respective one of a plurality of frequencies, and corresponding differences each in phase between high frequency voltage and related high frequency current, flexible measurement is possible to thereby enable the inventive effects to be used to a maximum.

Figure 10:
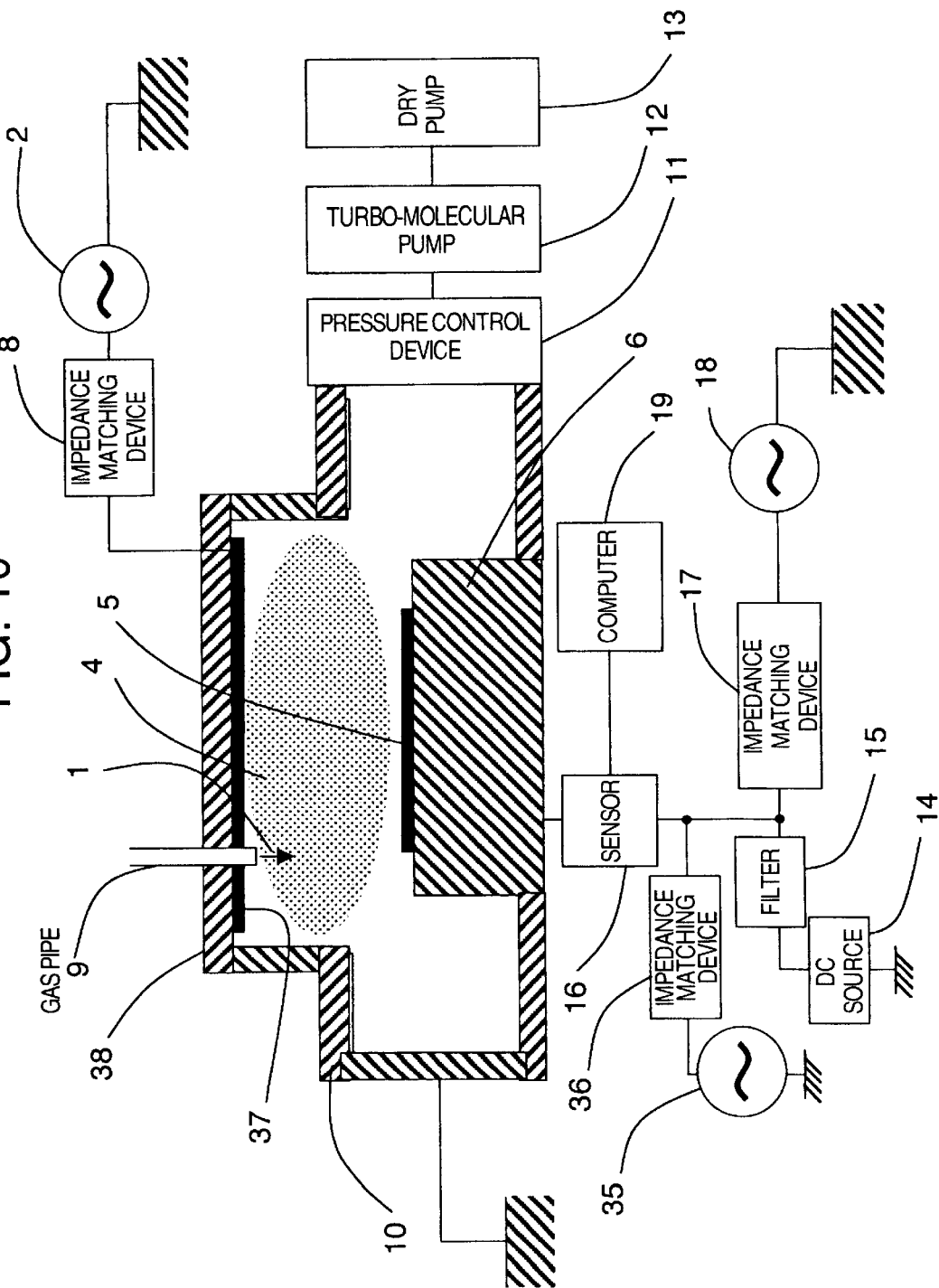
FIG. 10 illustrates a composition of a plasma processing apparatus according to a third embodiment of the present invention.

Next, referring to FIG. 10, a third embodiment of the present invention will be described. As will be seen from the first and second embodiments, the present invention can be used without relying on the method of producing plasma. Thus, the present invention can be carried out on all plasma processing apparatuss used for processing the semiconductor wafer. FIG. 10 illustrates the application of the present invention to a capacitively coupled plasma processing apparatus. In FIG. 10, reference numeral 38 denotes a ceiling of a vacuum chamber, and 37 a flat plate-like electrode that is capacitively coupled to plasma. As will be seen in comparison of FIGS. 10 and 9, the high frequency circuit indicated below the wafer stage 6 for the wafer 5 can be constituted so as to have exactly the same composition as in FIG. 9. The electrode 37 is not required to be in direct contact with the plasma.

Figure 11:
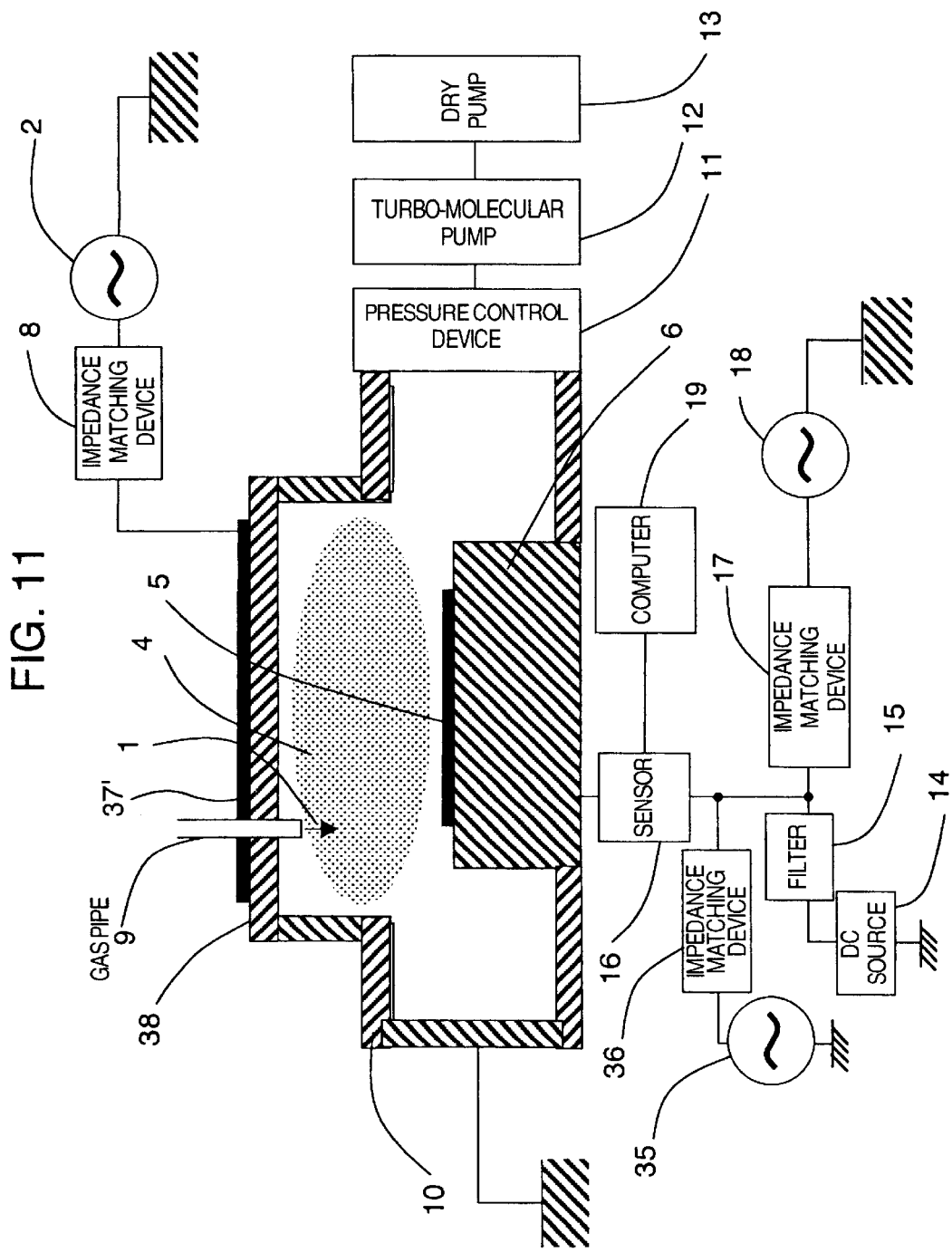
FIG. 11 illustrates a composition of a plasma processing apparatus according to a fourth embodiment of the present invention.

Referring to FIG. 11, a fourth embodiment of the present invention will be described. In FIG. 11, reference numeral 37' denotes a flat plate-like electrode that is capacitively coupled to plasma. As described above, the flat plate-like electrode is not required to be in direct contact with the plasma. The present invention applies quite likewise even when there is a ceiling 38 of a semiconductor/insulating material between the electrode 37' and plasma 4. That is, the present invention is likewise applicable to a plasma processing apparatus whatever compositions a region above the wafer 5 where the plasma is produced and its periphery may have. The plasma sources for the plasma processing apparatus can include a microwave plasma source, an electron cyclotron resonance plasma source, an inductively coupled plasma source, a capacitively coupled plasma source, a helicon plasma source, a magnetic neutral line plasma source, a surface wave plasma source, etc.

Figure 12:
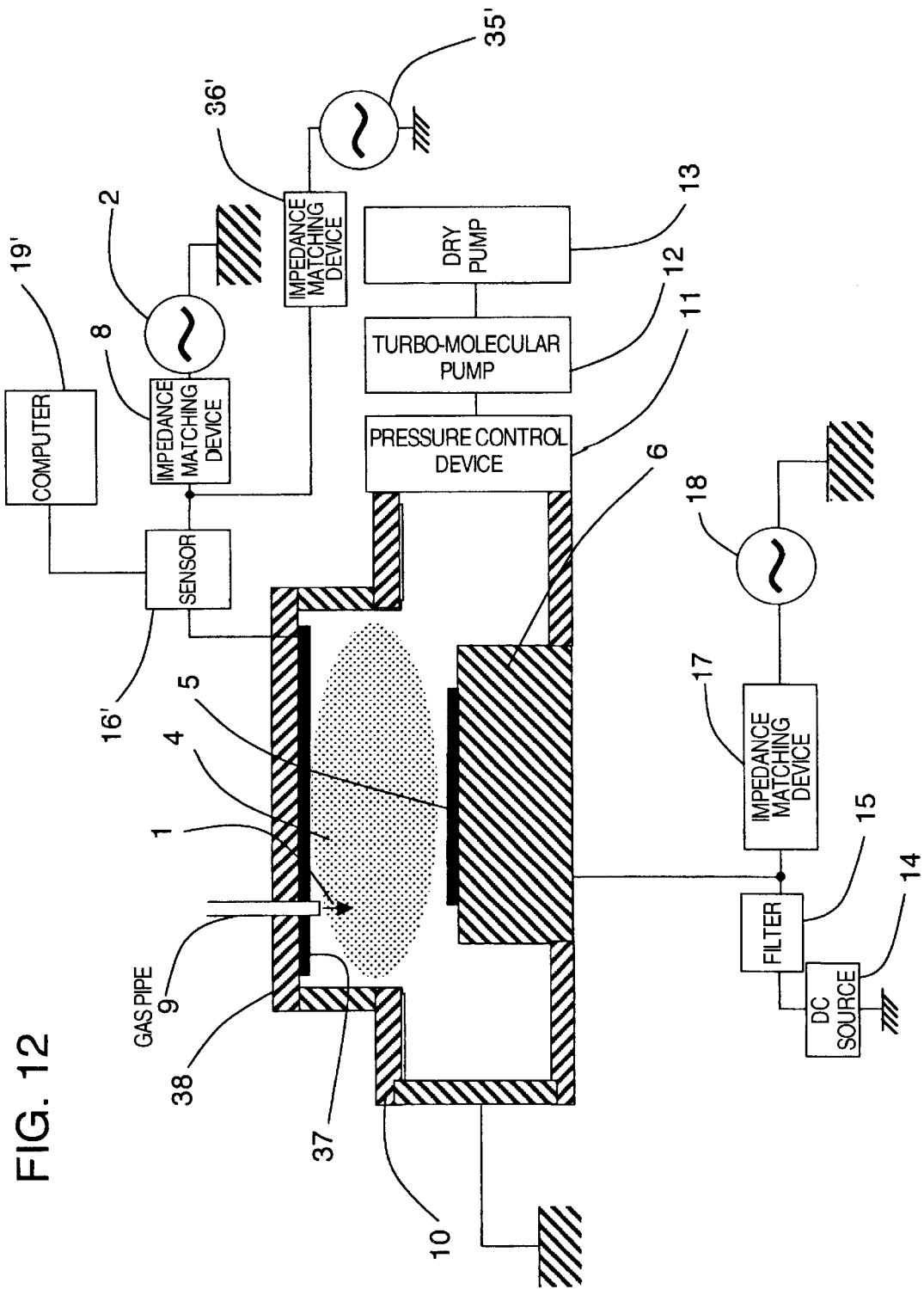
FIG. 12 illustrates a composition of a plasma processing apparatus according to a fifth embodiment of the present invention.

Referring to FIG. 12, a fifth embodiment of the present invention will be described next. In FIG. 12, reference numerals 35' and 36' denote a high frequency source for measuring the plasma characteristic, and an impedance matching device, respectively. Reference numerals 16' and 19' denote a sensor and a data processing computer, respectively.

The second embodiment mentioned above has the feature that the plasma characteristic can be measured, completely independent of the high frequency that directly processes the semiconductor wafer, using the high frequency source 35 for measuring the plasma characteristic. The present invention uses an electrode substantially capacitively coupled to the plasma to evaluate a plasma characteristic based on the real resistance component of the plasma load impedance and the real current component flowing into the electrodes. The present invention is not necessarily required to use only the semiconductor wafer as the electrode. As illustrated by the fifth embodiment, the high frequency source 35' for measuring the plasma characteristic and the impedance matching device 36' can be incorporated into a discharge high-frequency circuit of the capacitively coupled plasma processing apparatus. At this time, like the first, third and fourth embodiments, it is necessary that the high frequency source 35' is different in frequency from the high frequency source 2, and that the impedance matching device 36' comprises a filter that prevents power from the high frequency source 2 from reaching the high frequency source 35'. The sensor 16' senses a high frequency voltage and current from the high frequency source 35' and a difference in phase between the high frequency voltage and the current. By determining an equivalent circuit from the sensor 16' to the electrode 37 in this state, the real resistance component of the plasma impedance and the real current component, as viewed from the electrode 37, can be evaluated to thereby calculate the electron temperature and density. At this time, the characteristic of the plasma that can be measured is that of a plasma around the electrode 38.

As will be seen in the above embodiments, the present invention can be carried out, using the electrode capacitively coupled to the plasma. The electrodes capacitively coupled to the plasma include not only the semiconductor wafers, and the discharge electrodes for producing plasma described in the first–fifth embodiments, but also susceptors of the semiconductor wafers, and ungrounded Farady shields used in the inductively coupled plasma. Such electrodes may further include a dedicated electrode attached to a wall, disclosed in JP-A-8-222396, and an electrode received within a protective pipe and extending from a wall, as disclosed in JP-A-2000-100599.

As described above, by using existing electrodes such as a semiconductor wafer or a discharge electrode capacitively coupled to the plasma, the plasma characteristic can be measured without inserting a sensor into the plasma near the semiconductor wafer and hence without caring a reduction in the yield of the products. Since the sensor is only attached to the atmosphere side of the semiconductor manufacturing apparatus, attachment of the sensor is simple, and the plasma measurement can be performed without altering the existing semiconductor manufacturing apparatus greatly. Since the plasma characteristic near the semiconductor wafer that directly influences the processing of the semiconductor wafer can be measured, the inventive apparatus is optimal to examination of the processed state of the semiconductor wafer.

The present invention is also usable for monitoring the aging/abnormality of the apparatus. By using information on the aging, the times when the apparatus should be stopped/maintained can be determined. For example, when a rapid change in the plasma characteristic is recognized after the number of wafers etched increase while monitoring the plasma characteristic, it is easily predicted that some abnormality has occurred. That is, the invention is usable as a device for monitoring if the etching is proceeding normally. In this case, occurrence of abnormality in the apparatus can be immediately determined to thereby suppress useless processing of the wafer to a minimum. When the standard plasma characteristic changes, control parameters for the apparatus can be manipulated to restore the standard plasma characteristic.

As described above, according to the present invention, the wafer processing is always performed in the range of predetermined conditions and hence with very high reproducibility. Thus, products of uniform performance or high reliability are obtained. Thus, the yield of the products is high, and the cost is reduced to thereby provide products of a reduced price.

By monitoring the real resistance component of the load impedance under predetermined high frequency voltage requirements during etching, information on changes in the electron temperature is obtained. By monitoring the real current component flowing into the semiconductor wafer, information on changes in the electron density is obtained. Thus, the plasma characteristic can be monitored even during processing of the semiconductor wafer.

In the method of monitoring the load impedance in the separate real resistance and imaginary components or in the method of monitoring the current component flowing into the semiconductor wafer in the separate real and inductive current components, it is possible to easily specify what changed and/or what its cause is, in monitoring the processed state of the semiconductor wafer and the aging of the apparatus.

As described above, according to the present invention, it is possible to acquire information on the electron density and temperature of the plasma near a wafer without inserting a special sensor into the plasma around the wafer. The plasma processing apparatus and its etching process can be controlled based on the acquired information.

What is claimed is:

1. A plasma processing apparatus comprising:
    a body of the plasma processing apparatus including a vacuum processing chamber that contains a wafer stage on which a semiconductor wafer is held, a plasma producing unit for producing plasma within said vacuum chamber, and a high frequency source for applying a high frequency bias voltage to said wafer stage; and
    a control unit for controlling various parameters of said body of the plasma processing apparatus, wherein
        said control unit includes a detecting unit for detecting a high frequency voltage and high frequency current applied from said high frequency source to said wafer stage and for obtaining a phase difference between the high frequency voltage and the high frequency current applied to said wafer stage, wherein said detecting unit further detects, at an output of an equivalent circuit of said wafer stage, a voltage generated at said wafer and a current flowing into said wafer, and a phase difference between said voltage generated at said wafer and said current flowing into said wafer.

2. The plasma processing apparatus according to claim 1, wherein:
    said control unit further includes a unit for obtaining a characteristic of the plasma or an electric characteristic of the plasma processing apparatus based on the detected high frequency voltage applied to said wafer, the detected high frequency current applied to said wafer, and the obtained phase difference between the high frequency voltage and the high frequency current applied to said wafer.

3. The plasma processing apparatus according to claim 2, wherein:
said control unit further includes a unit for displaying on a display device the obtained plasma characteristic or the obtained electric characteristic of the plasma processing apparatus.

4. The plasma processing apparatus according to claim 2, wherein:
said control unit further includes a unit for controlling said body of the plasma processing apparatus based on the obtained plasma characteristic or the obtained electric characteristic of the plasma processing apparatus.

5. The plasma processing apparatus according to claim 1, wherein:
said control unit includes a unit for calculating at least one of plasma electron density and electron temperature based on the detected high frequency voltage applied to said wafer, the detected high frequency current applied to said wafer, and the obtained phase difference between the high frequency voltage and the high frequency current applied to said wafer.

6. The plasma processing apparatus according to claim 1, wherein:
said control unit includes a unit for calculating at least one of a real component and an imaginary component of an electric current flowing in the semiconductor wafer based on the detected high frequency voltage applied to said wafer, the detected high frequency current applied to said wafer, and the obtained phase difference between the high frequency voltage and the high frequency current applied to said wafer, and a unit for controlling said body of the plasma processing apparatus based on a result of the calculation.

7. The plasma processing apparatus according to claim 1, wherein:
said control unit includes a unit for calculating at least one of a real component and an imaginary component of an electric current flowing in the semiconductor wafer, and at least one of a real component and an imaginary component of a load impedance of the plasma processing apparatus, based on the detected high frequency voltage applied to said wafer, the detected high frequency current applied to said wafer, and the obtained phase difference between the high frequency voltage and the high frequency current applied to said wafer, and a unit for controlling said body of the plasma processing apparatus based on a result of the calculation.

8. The plasma processing apparatus according to claim 1, wherein:
said various processing parameters include at least one of a frequency or a power of said high frequency source for producing the plasma in said plasma producing unit; a frequency, a voltage or a power of said high frequency source to be applied to said wafer stage; a temperature or its distribution of a wall of said vacuum chamber; a temperature and its distribution of the wafer; a processing pressure, types of components, a flow and a mixing ratio of the components, of a processing gas to be used; a intensity and its distribution of a magnetic field applied to the plasma; and an etching time.

9. The plasma processing apparatus according to claim 1, wherein:
said control unit includes a database that records a relationship among changes in at least one of real and imaginary components of a current flowing in the semiconductor wafer, changes in at least one of real and imaginary components of a load impedance of the plasma processing apparatus, and changes in a state of the plasma processing apparatus.

10. A plasma processing apparatus comprising:
a body of the plasma processing apparatus including a vacuum processing chamber that contains a wafer stage on which a semiconductor wafer is held, a plasma producing unit for producing plasma within said vacuum chamber, and a first high frequency source for applying a first high frequency bias voltage to the wafer stage; and a second high frequency source for measuring the plasma for applying a second high frequency bias voltage to said wafer stage;
a control unit for controlling various parameters of said body of the plasma processing apparatus, wherein
the first high frequency differs in frequency from the second high frequency;
said control unit includes a first detecting unit for detecting the high frequency voltage or high frequency current applied from the first high frequency source to said wafer stage or for obtaining a phase difference between the high frequency voltage and the high frequency current from said first high frequency source, and
said control unit further includes a second detecting unit for detecting the high frequency voltage or high frequency current applied from said second high frequency source to said wafer stage or for obtaining a phase difference between the high frequency voltage and the high frequency current from said second high frequency source.

11. The plasma processing apparatus according to claim 10, wherein:
said control unit further includes a unit for obtaining a characteristic of the plasma or an electric characteristic of the plasma processing apparatus based on the high frequency voltage and current detected, and the phase difference obtained, by said first or second detecting unit.

12. The plasma processing apparatus according to claim 11, wherein:
said control unit further includes a unit for displaying on a display device the obtained plasma characteristic or the obtained electric characteristic of the plasma processing apparatus.

13. The plasma processing apparatus according to claim 12, wherein:
said control unit further includes a unit for controlling said body of the plasma processing apparatus based on the obtained plasma characteristic or the obtained electric characteristic of the plasma processing apparatus.

14. The plasma processing apparatus according to claim 10, wherein:
said control unit includes a unit for calculating at least one of a plasma electron density and electron temperature based on the high frequency voltage and high frequency current detected by said second detecting unit, and the phase difference between the high frequency voltage and the high frequency current obtained by said second detecting unit.

15. The plasma processing apparatus according to claim 10, wherein:
said control unit includes a unit for calculating at least one of a real component and an imaginary component of an electric current flowing in the semiconductor wafer based on the high frequency voltage and high frequency current detected by said first or second detecting unit, and the phase difference between the high frequency voltage and the high frequency current obtained by said first or second detecting unit, and a unit for controlling said body of the plasma processing apparatus based on a result of the calculation.

16. The plasma processing apparatus according to claim 10, wherein:
said control unit includes a unit for calculating at least one of a real component and an imaginary component of an electric current flowing in the semiconductor wafer, and at least one of a real component and an imaginary component of a load impedance of the plasma processing apparatus based on the high frequency voltage and high frequency current detected by said second detecting unit, and the phase difference between the high frequency voltage and the high frequency current obtained by said second detecting unit, and a unit for controlling said body of the plasma processing apparatus based on a result of the calculation.

17. The plasma processing apparatus according to claim 10, wherein:
said various processing parameters include at least one of a frequency or a power of said high frequency source for producing the plasma in said plasma producing unit; a frequency, a voltage or a power of said high frequency source to be applied to said wafer stage; a temperature or its distribution of a wall of said vacuum chamber; a temperature and its distribution of the wafer; a processing pressure, types of components, flow and mixing ratio of the components, of a processing gas to be used; a intensity and its distribution of a magnetic field applied to the plasma; and an etching time.

18. The plasma processing apparatus according to claim 10, wherein:
said control unit includes a database that records a relationship among changes in at least one of real and imaginary components of a current flowing in the semiconductor wafer, changes in at least one of real and imaginary components of a load impedance of the plasma processing apparatus and changes in a state of the plasma processing apparatus.

19. The plasma processing apparatus according to claim 1, wherein:
said control unit further includes a unit for obtaining a characteristic of the plasma based on a principle of a double probe method or obtaining an electric characteristic of the plasma processing apparatus based on the detected high frequency voltage applied to said wafer, the detected high frequency current applied to said wafer, the obtained phase difference between the high frequency voltage and the high frequency current applied to said wafer, and said equivalent circuit of said wafer stage.

20. The plasma processing apparatus according to claim 1, wherein:
said control unit includes a unit for calculating at least one of plasma electron density and electron temperature based on the detected high frequency voltage applied to said wafer, the detected high frequency current applied to said wafer, the obtained phase difference between the high frequency voltage and the high frequency current applied to said wafer, and based on a principle of a double probe method.

21. A plasma processing apparatus comprising:
a body of the plasma processing apparatus including a vacuum processing chamber that contains a wafer stage on which a semiconductor wafer is held, means for producing plasma within said vacuum chamber, and means for applying a high frequency bias voltage to said wafer stage; and
control means for controlling various parameters of said body of the plasma processing apparatus, wherein
said control means includes detecting means for detecting the high frequency voltage and high frequency current applied from said high frequency source to said wafer stage and for obtaining a phase difference between the high frequency voltage and the high frequency current applied to said wafer stage, wherein said detecting means further includes means for detecting, at an output of an equivalent circuit of said wafer stage, a voltage generated at said wafer and a current flowing into said wafer, and a phase difference between said voltage generated at said wafer and said current flowing into said wafer.

* * * * *